United States Patent [19]
Rao

[11] Patent Number: 5,963,468
[45] Date of Patent: Oct. 5, 1999

[54] LOW LATENCY MEMORIES AND SYSTEMS USING THE SAME

[75] Inventor: G. R. Mohan Rao, Dallas, Tex.

[73] Assignee: Silicon Aquarius, Inc.

[21] Appl. No.: 09/016,559

[22] Filed: Jan. 30, 1998

[51] Int. Cl.[6] .................................................. G11C 11/24
[52] U.S. Cl. ...................... 365/149; 365/203; 365/230.06
[58] Field of Search .............................. 365/149, 189.02, 365/230.02, 203, 230.06

[56] References Cited

U.S. PATENT DOCUMENTS

| | | | |
|---|---|---|---|
| 4,896,294 | 1/1990 | Shimizu et al. | 365/149 |
| 5,007,022 | 4/1991 | Leigh | 365/189.04 |
| 5,010,519 | 4/1991 | Yoshimoto et al. | 365/149 |
| 5,377,142 | 12/1994 | Matsumura et al. | 365/149 X |
| 5,781,482 | 7/1998 | Sakata | 365/149 X |

OTHER PUBLICATIONS

"Transparent–Refresh DRAM (TreD) Using Dual–Port DRAM Cell" by Sakurai, Nogami, Sawada and Iizuka, 1998 IEEE Custom Integrated Circuits Conference pp. 4.3.1 through 4.3.4.

*Primary Examiner*—Huan Hoang
*Attorney, Agent, or Firm*—James J. Murphy; Winstead Sechrest & Minick

[57] ABSTRACT

A memory 400 including a memory cell 501 disposed at the intersection of an addressable row and addressable column, memory cell 501 being accessible via a selected one of a pair of wordlines 503a, 503b associated with the row and a selected one of a pair of bitlines 502a, 502b associated with the column.

21 Claims, 7 Drawing Sheets

LOW LATENCY MEMORIES AND SYSTEMS USING THE SAME

TECHNICAL FIELD OF THE INVENTION

The present invention relates in general to electronic memories and in particular to low latency memories and systems using the same.

BACKGROUND OF THE INVENTION

There are numerous ways in which a dynamic random access memories (DRAMs) are traditionally constructed, using variations in process, circuit designs, and system architecture. By varying these parameters, various problems related to device size and performance can be addressed. None the less, all currently available DRAMs are generally based upon architectures which share the following disadvantageous characteristics.

First, the typical general purpose DRAM has a single data port for writing and reading data to and from addressed storage locations ("dual ported" DRAMs are available which provide two data ports, typically one random and one serial port, however, these devices are normally limited to special memory applications).

Second, data writes and reads are only made to a given array on a location by location (e.g. one bit, one byte, one word) basis and only during the array active cycle. Specifically, in a "random access mode", an access (read or write) is made to a single location per row address strobe (/RAS) active cycle and in a "page mode" an access is made to a single location per column address strobe (/CAS) or master clock cycle of the row addressed during the given /RAS cycle. During the inactive cycle, the array is in precharge and no accesses can be made to that array.

Third, no method has generally been established to handle contention problems which arise when simultaneous requests for access are made to the same DRAM unit. Current techniques for handling contention problems depend on the DRAM and/or system architecture selected by the designer and range, for example, from "uniform memory-noncontention" methods to "non-uniform memory access" (NUMA) methods.

Similarly, the system architectures of personal computers (PCs) generally share a number of common features. For example, the vast majority of today's PCs are built around a single central processing unit (CPU), which is the system "master." All other subsystems, such as the display controller, disk drive controller, and audio controller then operate as slaves to the CPU. This master/slave organization is normally used no matter whether the CPU is a complex instruction set computer (CISC), reduced instruction set computer (RISC), Silicon Graphics MIPS device or Digital Equipment ALPHA device.

Present memory and PC architectures, such as those discussed above, are rapidly becoming inadequate for constructing the fast machines with substantial storage capacity required to run increasingly sophisticated application software. The problem has already been addressed, at least in part, in the mainframe and server environments by the use of multiprocessor (multiprocessing) architectures. Multiprocessing architectures however are not yet cost effective for application in the PC environment. Furthermore, memory contention and bus contention are still significant concerns in any multiprocessing system, let alone in a multiprocessing PC environment.

Thus, the need has arisen for new memories for use in high speed and/or multiprocessing systems. Preferably, such memories should have a "transparent" precharge and/or multiple random access ports. Additionally, these memories should be capable of use in addressing memory contention problems, especially those occurring in multiprocessing systems.

SUMMARY OF THE INVENTION

According to one embodiment of the present teachings, a memory cell is disposed at the intersection of an addressable row and an addressable column, the memory cell accessible via a selected one of a pair of wordlines associated with the row and a selected one of a pair of bitlines associated with the column.

According to another embodiment of the principles of the present invention, a memory array is disclosed including first and second wordlines defining a row and first and second bitlines defining a column. A memory cell is disposed at an intersection of the row and the column, the memory cell including data storage capacitor, a first transistor for selectively coupling the first bitline and a first plate of the capacitor in response to a signal presented on the first wordline and a second transistor for selectively coupling the second bitlines and a second plate of the capacitor in response to a signal presented on the second wordline.

The present inventive concepts also define a memory bank, which can be used alone as a memory device or as one bank in a multi-bank memory. The memory bank includes an array of rows and columns of memory cells, each row comprising first and second wordlines, each column comprising first and second bitlines, and each cell comprising a data storage capacitor, a first gating device for coupling the first bitline of a corresponding column and said capacitor in response to a signal presented on the first wordline of a corresponding row, and a second gating device for coupling the second bitline of the corresponding column and the capacitor in response to a signal presented on the second wordline of the corresponding row.

The present inventive concept can be applied to processing systems, such as one including a first processing resource, a second processing resource, and a memory. The memory includes an array of memory cells, first and second wordlines define a row of the cells, the first processing resource selecting the row for access via the first wordline, and the second processing resource selecting the row for access via a second wordline. First and second bitlines define a column of cells, the first processing resource accessing a selected cell along the selected row via the first bitline and the second processing resource accessing the selected cell via the second bitline.

The dual bitline/dual wordline approach has substantial advantages over the existing memory devices and systems. Among other things, this approach allows multiple processors in a multiprocessing system to access the same memory space with a minimum of contention problems. Additionally, this approach allows for transparent precharge, wherein the same cells can be accessed during both the conventional active and precharge cycles via appropriate use of the dual bitlines and dual wordlines.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–8 of the drawings, in which like numbers designate like parts.

Figure 1A:
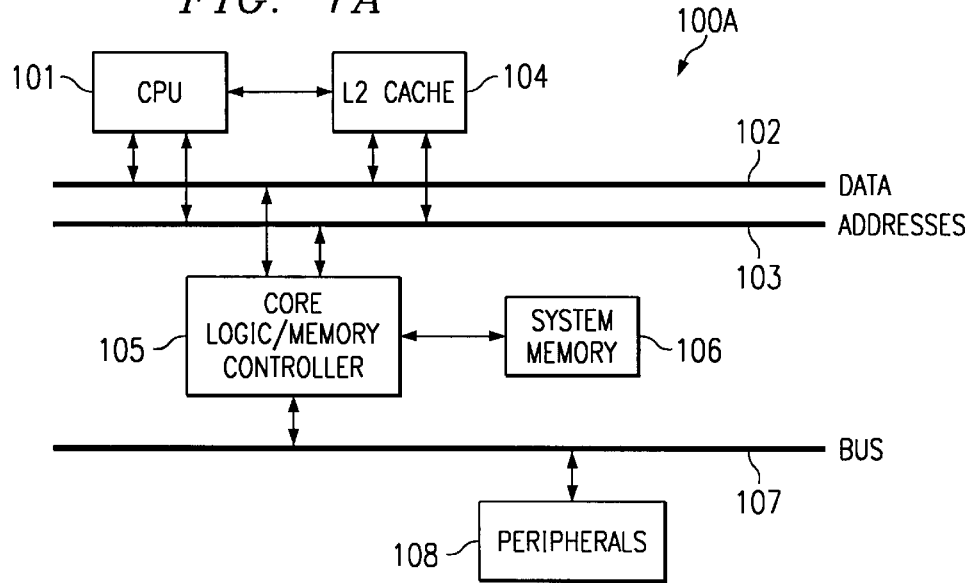
FIGS. 1A and 1B are block diagrams respectively depicting two basic system architectures 100A and 100B typical of those found in personal computers (PCs)
Figure 1B:
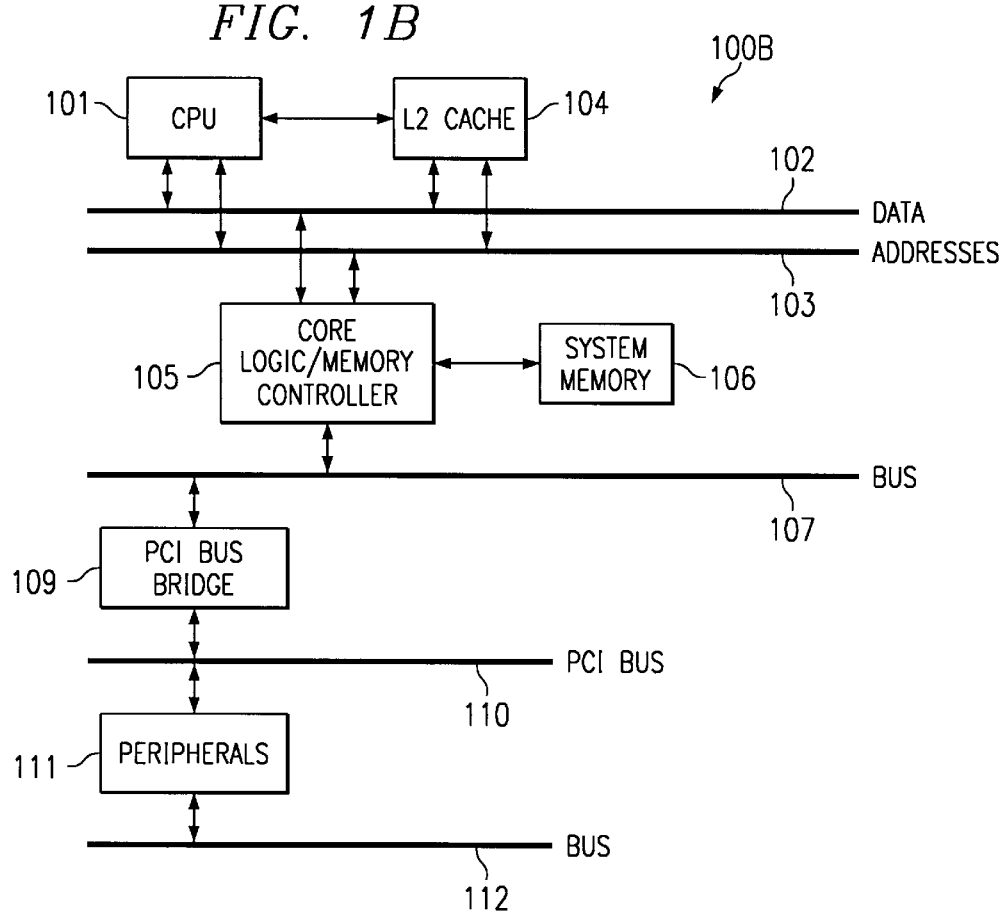

FIGS. 1A and 1B are block diagrams respectively depicting two basic system architectures 100A and 100B typical of those found in personal computers (PCs). While numerous variations on these basic architectures exist, FIGS. 1A and 1B are suitable for describing the basic structure and operation of most PCs.

Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium™ class microprocessor, a reduced instruction set computer (RISC), such as a Apple PowerPC™ microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as SCLK (System Clock) /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache coherency, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

The principles of the present invention may also be embodied in multiprocessing devices and systems. Although a number multiprocessing architectures exist to which the principles of the present invention can be applied, FIGS. 2A, 2B and 2C respectively depict exemplary multiprocessor architectures 200A, 200B and 200C for discussion purposes.

Multiprocessing system 200A is based upon n number of CPUs 201. Each CPU 201 is associated with a dedicated cache 202 and dedicated (private) system memory 203. Common bus 204 allows a given CPU to exchange information with peripherals, including mass storage subsystems 204, such as disk drives, tape drives and cartridge units, and Input/Output subsystems 206, such as printers, displays and keyboards.

The memory organization of system 200A is typically categorized under the "no read/write memory access" (NORMA) paradigm. In NORMA based systems, the processors have no access to a common memory and all data sharing between processors occurs over communications links. NORMA typically is used in fully distributed systems.

System 200B also primarily includes n number of CPUs 201, each with an associated cache 202, and coupled to the peripheral devices through a common bus 204. In the case of system 200B, system memory 207 is also coupled to bus 204 and is shared by all the CPUs 201. A second bus 208 is provided as a second path for accessing system memory 207.

The memory architecture of system 200B is typically designated as a unified memory access (UMA) architecture. Under the UMA paradigm, all processors have equal access to system memory and all processors have local cache. The unified memory access architecture typically provides the fastest possible interaction between processors and is the common architecture used in PCs, work stations, and other desktop computing devices. UMA based systems are often referred to as "symmetric-multiprocessing" systems.

System 200C is a system in which both private and system memory are provided. Specifically, in addition to dedicated cache 202, each CPU 201 is also associated with private memory 209. Each CPU is further connected by bus 204 to a shared system memory 210.

The memory architecture of system 200C falls under the non-uniform memory access (NUMA) paradigm. Under the NUMA paradigm, each processor has a private memory and additionally shares system memory with the other processors in the system. One difficulty in a NUMA based system is the fact that the access times for the private and system memories may be different creating timing problems.

Figure 2A:
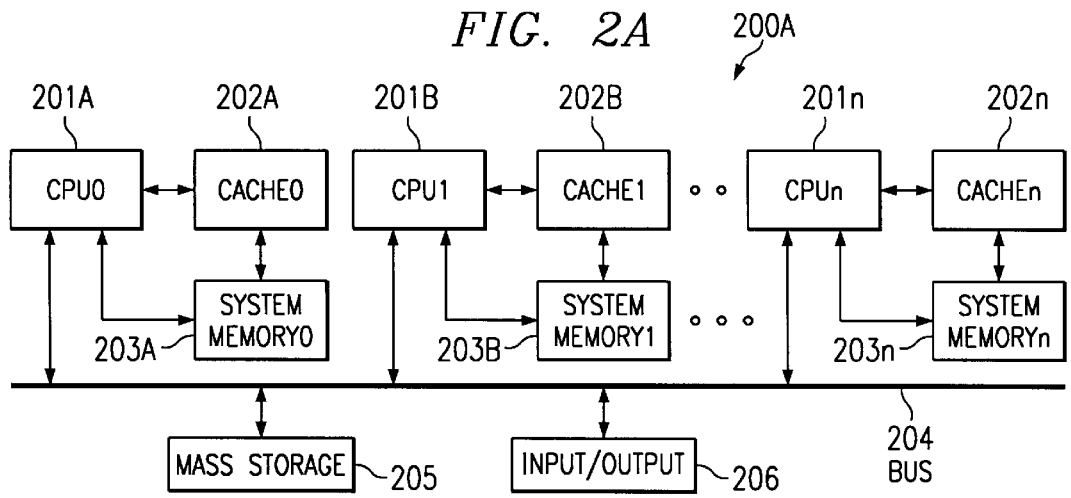
FIGS. 2A, 2B and 2C respectively depict exemplary multiprocessor architectures 200A, 200B and 200C.
Figure 2B:
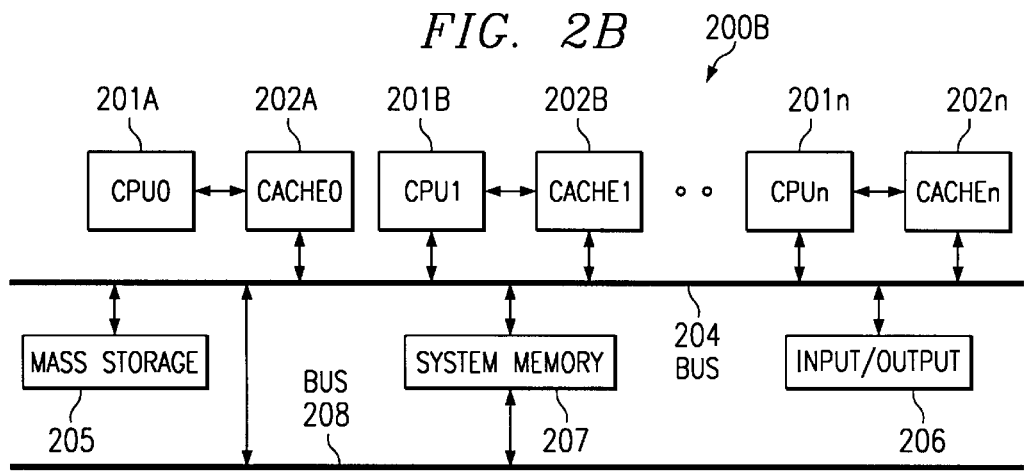
Figure 2C:
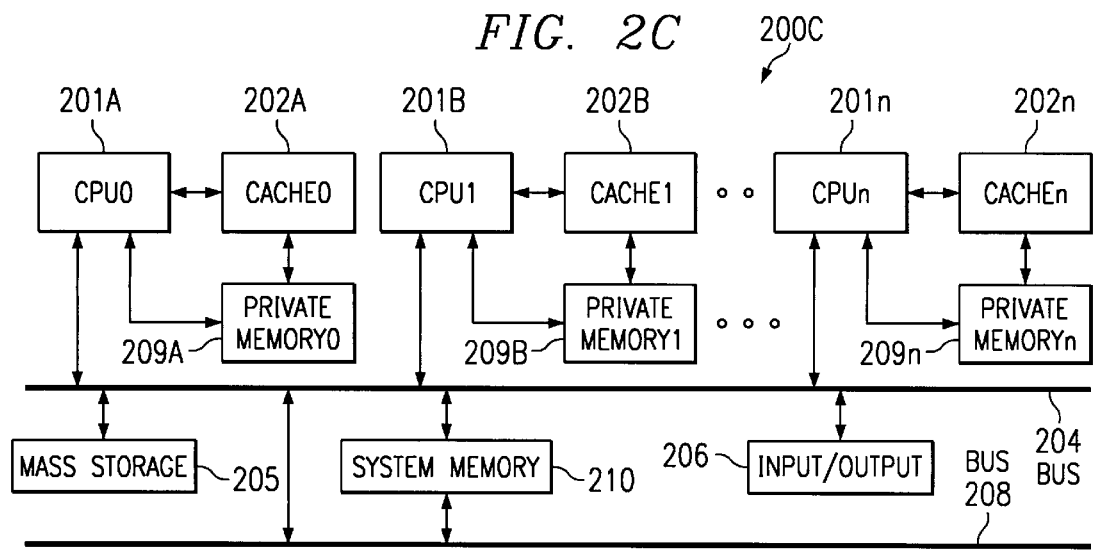

At the highest system level, there are a number of ways to implement the hardware architectures shown in FIGS. 2A, 2B and 2C in a complete hardware/software system. Three such systems are shown in FIGS. 3A–3C, respectively.

Figure 3A:
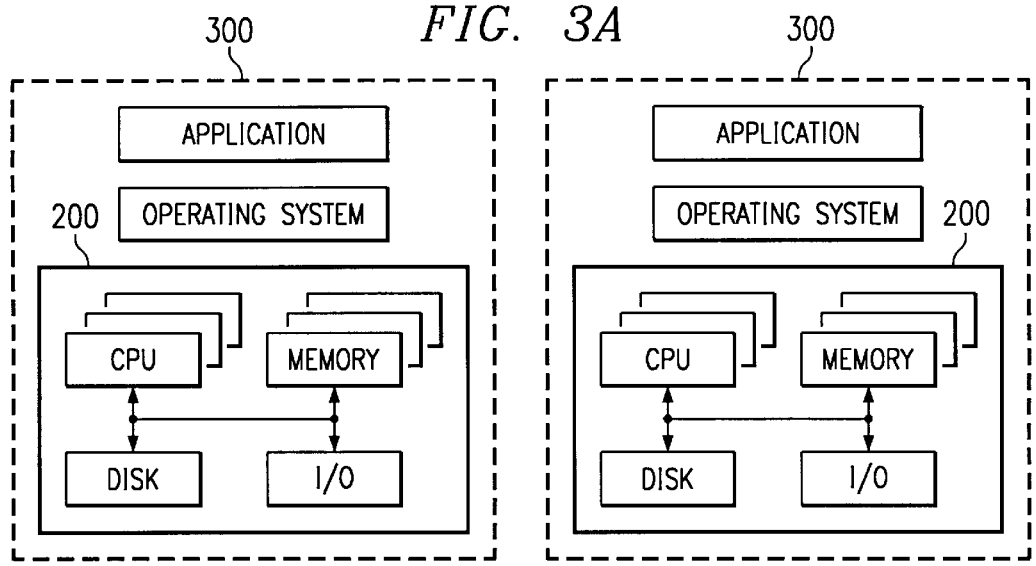
FIG. 3A is a diagram illustrating a "loosely coupled" multiprocessing architecture.

FIG. 3A is a diagram illustrating a "loosely coupled" multiprocessing architecture. In the loosely coupled architecture, each processing node 300 maintains a dedicated copy of both the operating system and the application programs. Loosely coupled architectures, such as that shown in FIG. 3A, are used often in embedded systems and in real-time systems in which tasks must be partitioned to different processing nodes for synchronization purposes. Embedded systems include those in which the CPU is fabricated on the same chip as logic, memory, a signal processor, or the like. High speed interconnects are used to share data and pass messages between processing nodes 300. While loosely coupled systems are more fault and error tolerant, their software programming is most often highly complex.

Figure 3B:
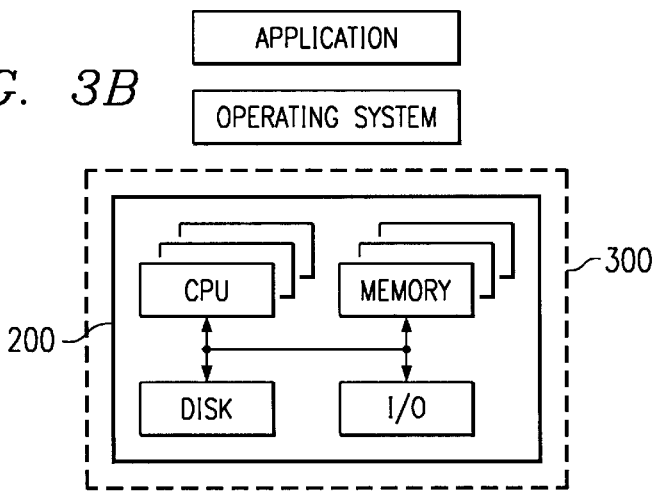
FIG. 3B depicts a "tightly coupled" system. In this case, a single copy of the operating system and a single copy of the application program are shared and executed by a single set of processors.

FIG. 3B depicts a "tightly coupled" system. In this case, a single copy of the operating system and a single copy of the application program are shared and executed by a single set of processors. Advantageously, writing software programs for a tightly coupled system is normally simpler than for writing programs to a loosely coupled system. However, tightly coupled systems, based only on single copies of the application programs and operating system, are less tolerant to errors and failures than the loosely coupled systems.

Figure 3C:
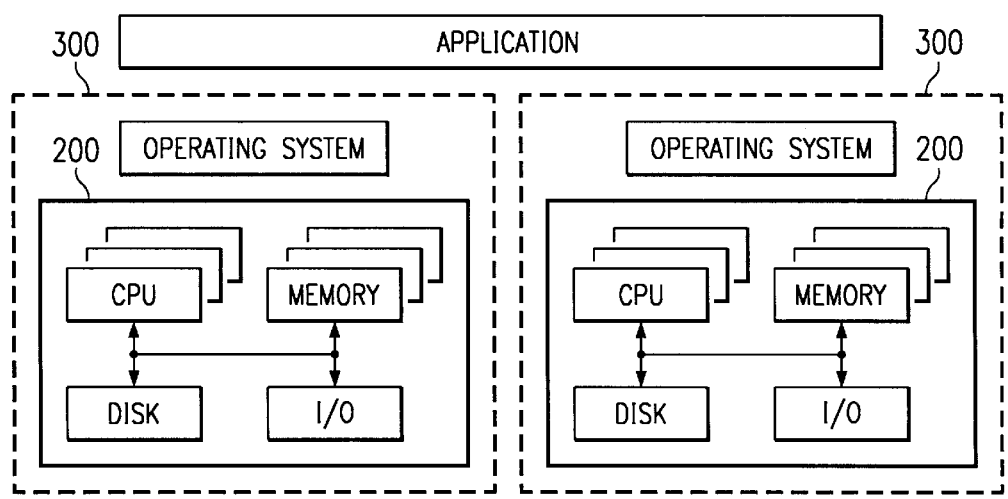
FIG. 3C is a diagram of a "snugly coupled" system in which each processing node 300 maintains a dedicated copy of the operating system and all nodes share a single copy of the applications program.

FIG. 3C is a diagram of a "snugly coupled" system in which each processing node 300 maintains a dedicated copy of the operating system and all nodes share a single copy of the applications program. The snugly coupled variation is a hybrid which provides the tolerance to failure/errors found in loosely coupled systems while still providing the simpler program found in tightly coupled systems.

Generally, under any of the UMA, NUMA or NORMA paradigms, the system will act differently depending upon the type of processor employed. For example, a CISC CPU may be "latency" dominated while a digital signal processor (DSP) based system may be "dataflow" dominated. Further, pipelined processing algorithms typically are dataflow intensive, since the processors perform operations on streams of data received from other processors in the system and then pass the results on to other processors.

There are major challenges which must be addressed in the design of almost any multiprocessing system. First, if an architecture, such as those used in system 200B or system 200C, in which a single system memory system is shared by multiple processors, the issue of memory contention must be addressed; a technique must be developed to handle the situation in which several processors attempt to simultaneously access the shared memory. This problem is compounded by the fact that the contention issues must be dealt with from design to design, since different processors interface with memory differently. For example, a RISC processor requires substantial memory space while a CISC processor requires substantial register space.

In a memory device or subsystem with a single data input/output port and a single address port, contention problems can be solved by "memory locking." In this case, while one CPU (or controller) is accessing a given memory device or subsystem, the other CPU (controller) is "locked out" and cannot access that same device/subsystem. Memory locking is a memory management task which may be performed by the memory management unit (MMU) on-board the CPUs themselves or by a stand-alone device or subsystem. In any event, memory locking reduces the efficiency which multiprocessing was intended to increase, since during a contention situation, at least one processor must wait to access data.

Another major challenge is the software design. Symmetric multiprocessing operating systems are preferred, since this type of operating system is capable of seamlessly passing application programs to the CPUs as they become available. As discussed above, the selection of between tightly, loosely and snugly coupled software architecture requires substantial trade-offs, and in particular trade offs between ease of programming and fault/error tolerance.

Further, when multiple processors (or controllers) are coupled to the same bus, bus contention problems may also arise. Specifically, when a shared bus is employed, only one processor is normally granted access to the bus to perform a given bus task, while the remainder of the processors coupled to that bus must wait until their priority has been reached. One technique for minimizing bus contention problems, is to provide a dedicated cache for each CPU, as shown in FIGS. 3A–3C, so that a given CPU need only access the bus at times when required data are not found in the dedicated cache. As a result, cache coherency is a major concern in the design of a multiprocessing system. In other words, when a given processor modifies a location in memory, some technique must be provided for insuring that the data is modified in the cache memory of each of the other processors using the same data.

Figure 4:
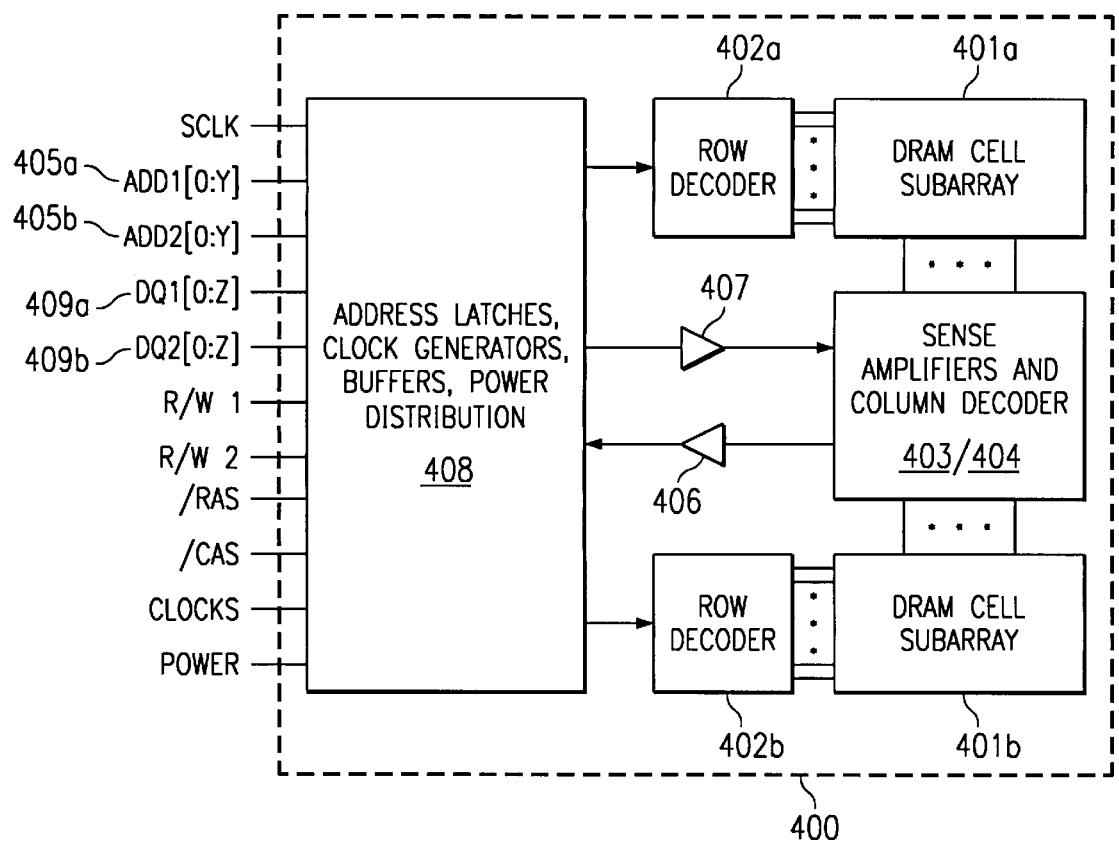
FIG. 4 is a high level functional block diagram of a DRAM memory 400.

FIG. 4 is a high level functional block diagram of a DRAM memory 400 embodying the teachings of the present invention. Memory 400 is suitable for such applications as system memory 106 in either of the exemplary single processor environments or any of the memories in the exemplary multiprocessing environments, such as private memory 203 of system 200A or shared memory 207 system 200B. Many other applications of memory 400 are possible.

Memory 400 includes a pair of subarrays 401a and 401b, each composed of rows and columns of DRAM cells. Each row of cells is associated with a pair of conductive wordlines and each column of cells is associated with a pair of conductive bitlines. This structure will be discussed in detail below. Generally however, during an access, a row of cells in array 401 is selected in response to a received row address by either row decoders 402a or 402b which activates one of the pair of the conductive wordlines coupled to the cells of the selected row. Data is input to or output from each cell along the row through one of the bitlines associated with the corresponding column (at the same time the other bitline for that column can be put into precharge).

During a read, the data from the entire active row of cells are sensed and latched by sense amplifiers 403. For discussion purposes, it will be assumed that the bitlines are coupled to sense amplifiers 403 in an open-bitline fashion, with complementary bitlines disposed in subarrays 401a and 401b respectively. During a read, column decoder 404, in response to a received column address(es), selectively passes desired data (e.g. in bits, bytes or words) from sense amplifiers 4403 from the appropriate locations along the active row. During a write, data are transferred to the proper cells along the active row directly column decoder 404 (data in sense amplifiers 403 are essentially written over).

In the illustrated embodiment, the data passed by column decoder 404 are selectively input to or output from device 400 through two Z-bit wide input/output (I/O) ports 405a (DQ1[0:Z]) and 405b (DQ2[0:Z]). Data being output (read) from memory 400 is driven by a set of read amplifiers 406. During a write, write buffers 407 drive received data from the given I/O port through the column decoder (which selects the bitlines of the cells to be written) and the sense amplifiers to array 401. While two I/O ports 404 are shown for illustration, in some embodiments only one such port is provided. In these cases, the single data I/O port 405, and/or the external data, is multiplexed. As will become apparent, data port 405 can be multiplexed such that one set of bitlines can be accessed during one cycle and a second set accessed during the immediately following cycle.

Block 408 generally shows the traditional input/output circuitry, including buffers address latches, power distribution circuitry and clock generation circuitry. In the illustrated embodiment, at least one multiplexed address bus is coupled to an Y-bit wide address port 409 (ADD[0:Y]) from which row addresses are latched in with the row address strobe (/RAS) and column addresses with the column address strobe (/CAS). It should be noted that two address ports, 409a and 409b, as shown in FIG. 4, may be used such that two data ports can be independently controlled and/or a single data I/O port controlled by two processors. (/RAS also controls the timing of bitline precharge and sense amplifier set-up; one bitline of each column is precharged and its sense amplifier set-up during the high periods of /RAS and the other bitline precharged and its sense amplifier set-up during the low periods of /RAS.)

Read/write signals R/W1 and R/W2 control the reading and writing of data to and from data ports 405a and 405b respectively. If a single port 405 is provided, then only a single read/write signal is necessary. If DRAM 400 is a synchronous DRAM, the CLOCKS will include the synchronous DRAM master clock (SCLK).

Figure 5:
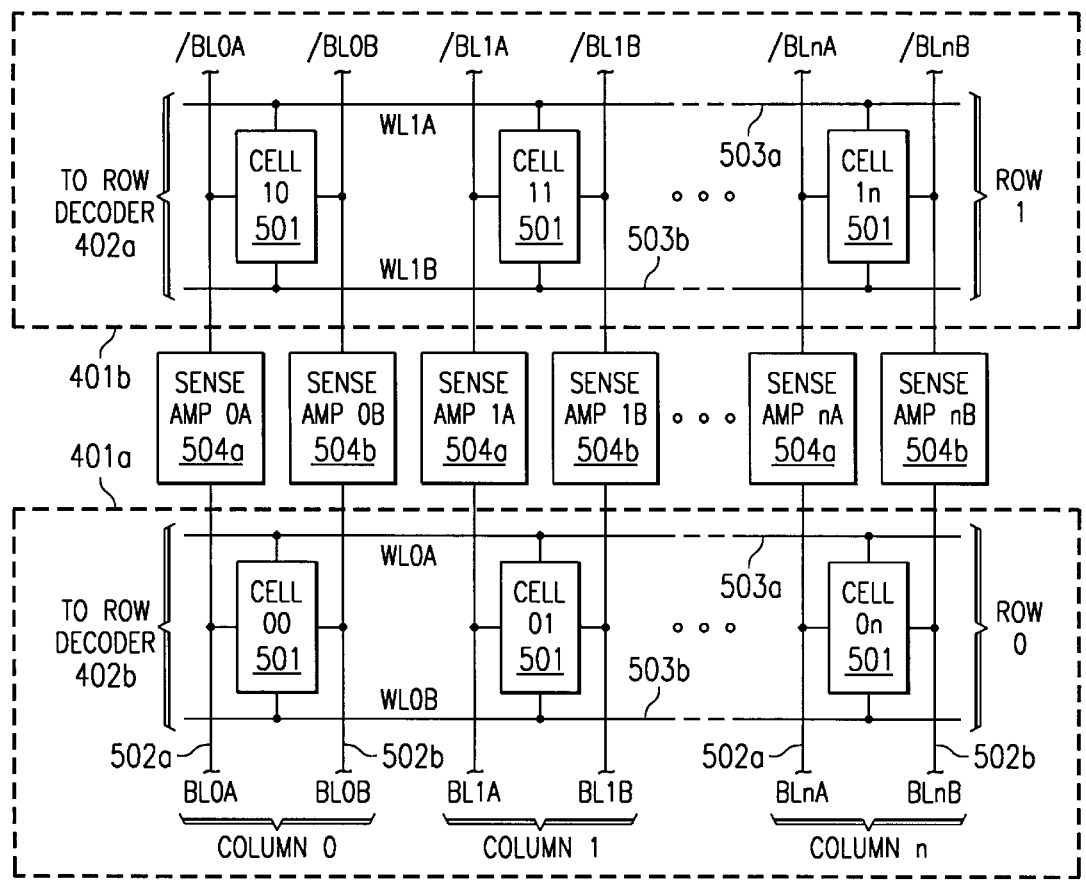
FIG. 5 is a more detailed block diagram of a very small portion of subarrays 401a and 401b and the corresponding sense amplifiers.

FIG. 5 is a more detailed block diagram of a very small portion of subarrays 401a and 401b and the corresponding sense amplifiers. Specifically, FIG. 5 shows three exemplary physical columns (Columns 0, 1 and n) and two exemplary rows (Rows 0 and 1) of an m row by n column array, with half of the rows disposed in each of subarrays 401a and 401b. In actual implementation then number of rows and columns will be much larger, the array could be, for example, 1024 rows by 1024 columns (i.e. m=n=1024) or larger.

In the illustrated embodiment of FIG. 5, an open bitline arrangement is employed, although a folded bitline approach could just as easily be used. Each cell 501 in each subarray 401 is coupled to a pair of bitlines 502a and 502b ($BL_iA$ and $BL_iB$, where i is the column number between 0 and n) and a pair of wordlines 503a and 503b ($WL_jA$ and $WL_jB$, where j is the row number between 0 and m). Each bitline 502a/502b of each column is coupled to a corresponding sense amplifier 504a or 504b, with the bitlines of subarrays 401a and 401b being complementary. For illustration, the even numbered pairs of wordlines 503 are shown in subarray 401a and the even numbered pairs shown in subarray 401b.

Figure 6:
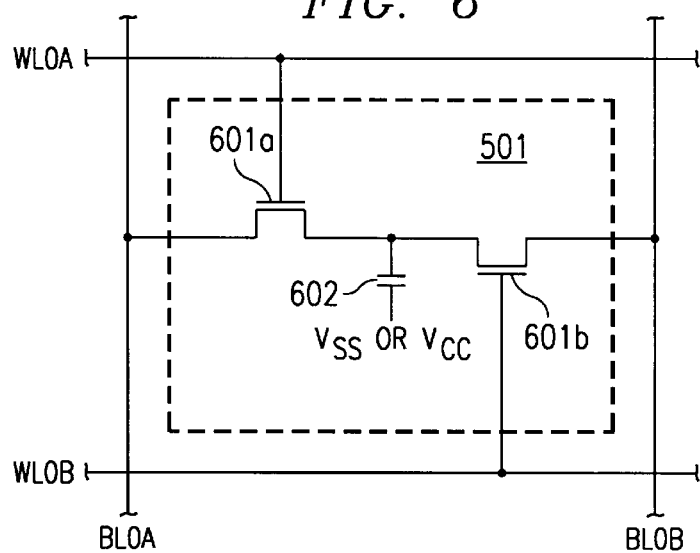
FIG. 6 depicts the preferred structure of cells 501.

The preferred structure of cells 501 is depicted in FIG. 6. For discussion purposes, the cell at the intersection of wordlines $WL_0A$ and $WL_0B$ and bitlines $BL_0A$ and $BL_0B$ is shown. Each cell includes a first pass transistor 601a for coupling a first plate of data storage capacitor 602 with bitline $BL_0A$ in response to active (high) voltage impressed on $WL_0A$. A second pass transistor 601b similarly selectively couples the storage capacitor 602 to bitline $BL_0B$ when an active (high) voltage is presented on $WL_0B$. Both Pass transistors, sharing the same "storage capacitor" cannot be simultaneously turned "on". For a complete description of cells 501 and their advantages, reference is now made to copending and coassigned patent application Ser. No. 08/911,737, filed Aug. 15, 1997 and entitled "LOW LATENCY DRAM CELL AND METHOD THEREFOR" (Attorney's Docket No. 17200-P011US) incorporated herein by reference.

Figure 7A:
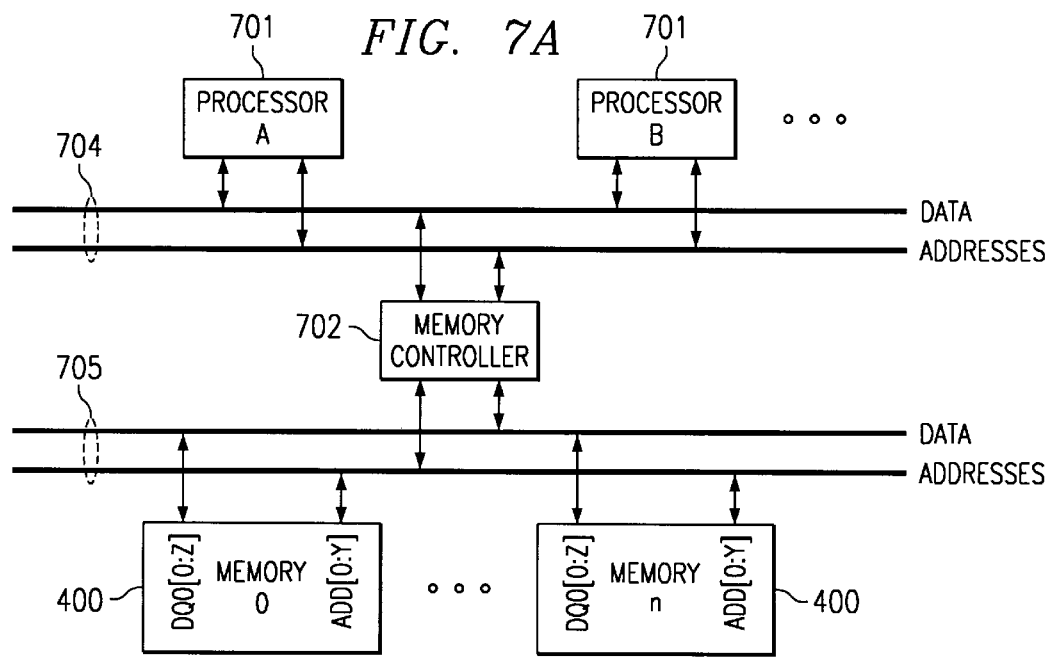
FIG. 7A depicts a multiprocessing environment including m number of processing elements 701.
Figure 7B:
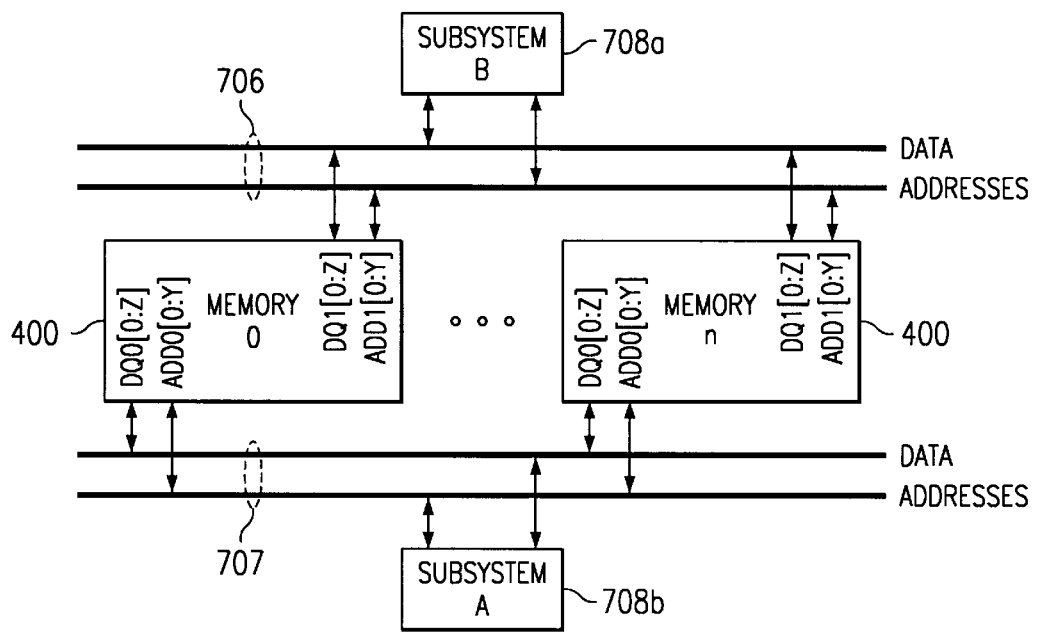
FIG. 7B depicts an exemplary applications for memory 400.

There are many possible applications for memory 400, two of which are shown in FIGS. 7A and 7B respectively. The operation of memories 400 in these and other applications will be illustrated in conjunction with the timing diagram of FIG. 7C.

FIG. 7A depicts a multiprocessing environment including m number of processing elements 701, which could be microprocessors, microcontrollers, audio or graphics engines, to name only a few possibilities. A memory controller 702 spans the data and address lines of CPU bus 704 and the data and address lines of memory bus 705. Coupled to memory bus 705 are n number of memories 400, each employing a single address port ADD[0:Y] and a single data port DQ[0:Z].

In the exemplary system shown in FIG. 7B. A pair of buses 706 and 707 are spanned by n number of memories 400. A pair exemplary subsystems 708a and 708b are depicted, coupled to buses 706 and 707 respectively. Subsystems may be for example microprocessors or microcontrollers, memory controllers, etc. In contrast the embodiment of FIG. 7A, in this embodiment two address ports ADD0[0:Y] and ADD1[0:Y] and two data ports DQ)0 [0:Z] and DQ1[0:Z] are utilized.

Notwithstanding the number of address ports uses, the decoding of the received row and column addresses can be done in a number of different ways. For example, addresses received from processor 1 may be decoded to exclusively access wordlines $WL_iA$ and bitlines $BL_iA$ while processor 2 generated addresses access wordlines and bitlines $WL_iB$ and $BL_iA$ exclusively. Alternately, bitlines and wordlines $BL_iA$ and $WL_iA$ can be assigned a first address space and bitlines and wordlines $WL_iB$ and $BL_iB$ assigned a second address space. In this case, one or more address bits would direct the access to the proper address space; all processors in the multiple processor system would have access to both address spaces. Further, all the wordlines and bitlines can be in equivalent address spaces (for example, the row address for wordline $WL_iA$ will equal the row address for wordline $WL_iB$, etc.) In this case a toggle bit would be used to select between the "A" set of bitlines and wordlines and the "B" set of wordlines and bitlines. This toggle bit could be generated by the core logic or memory controller and would insure that two successive accesses to the same set are not made during the same period of the/RAS cycle. (The rising and falling edges of /RAS could also serve the functions of the toggle bit.)

The operation of memories 400 can now be described. For purposes of discussion, and as shown in FIG. 2, it is being arbitrarily assumed that one or more of the bitlines $BL_iA$ are active during the period when /RAS is at a logic low level and in precharge when /RAS is at a logic high level. Additionally, assume that one or more of the bitlines $BL_iB$ is in precharge when /RAS is low and active when /RAS is high.

First consider the case where a single address port ADD and two data ports are used. On the falling edge of /RAS, a row address is latched-in through address port ADD for activating the wordline $WL_iA$ of the selected row, for example wordline $WL_0A$ of Row 0. Also, when /RAS transitions low, the active state for bitlines $WL_iA$ and corresponding sense amplifiers 504a begins. At the same time, precharge of bitlines $BL_iB$ is initiated. Shortly thereafter, pass transistor 601a of each cell 501 of Row 0 is turned-on and capacitors 602 for that row are available for access through bitlines $BL_iA$. For a read, the data are sensed and latched in sense amplifiers 504a. In the case where Row 0 is selected, bitlines $BL_iA$ of subarray 401a carry data and bitlines $BL_iA$ of subarray 401b are used as the complementary bitlines for sensing purposes.

On each falling edge of /CAS, a column address is latched-in through address port ADD and the words of data are transferred to or from the sense amplifier 501a via first data port DQ0 (/CAS can also be generated on-chip). The width of each word of data is a design choice; in a by 16 device 16 bits are accessed per column address (/CAS cycle). The number of words paged out during the time when /RAS is low can vary from one up to the maximum number of words per row, depending on the application.

With the rising edge of /RAS, bitlines $BL_iA$ are precharged and sense amplifiers 504a prepared for the next low period of /RAS. At the same time, bitlines $BL_iB$ and sense amplifiers 504b become available. Again row and column addresses are latched-in through address port ADD with the falling edges of /RAS and /CAS. During the high period of /RAS, the row address received and decoded accesses one of the "B" wordlines $WL_jB$. The column accesses then occur for bitlines $BL_iB$ in a manner similar to that discussed above with regards to bitlines $BL_iA$.

In view of the foregoing discussion, it becomes readily apparent that memories, such as memory 400, according the present inventive teachings have many advantages over traditional DRAMs. Among other things, precharge is "transparent." In other words, where as in a traditional DRAM data cannot be accessed during the period when /RAS is high, the present teachings allow for data accesses during both the periods when /RAS is high and /RAS is low. Further, memories such as memory 400 are particularly useful in multiprocessing applications. In the system of FIG. 7A for example, data can be accessed by Processor A using the "A" bitlines and wordlines during the first half of the /RAS cycle and Processor B can access the same data during the second half of the same /RAS cycle. Not only does this increase processing speed (with two accesses per /RAS cycle) but also helps insure that each processor is accessing the most up to date data.

In the preferred embodiment, two consecutive accesses to the "A" bitlines and wordlines or two consecutive accesses to the "B" bitlines and wordlines are not allowed. Thus, some memory management device or software in the overall system, in FIG. 7A, should be provided to insure that such forbidden accesses are not attempted.

The lower timing trace illustrates double data rate accesses, wherein a word is accessed on both the rising and falling edges of SCLK. For convenience, only a few cycles are shown, although DDR operations can be performed through both DQ ports.

In addition to the applications described above, there are many specific uses of the present concepts. In graphics applications, these concepts can applied to the memory used for texture caching, texture compression and scatter-gather burst mastering. In digital signal processing (DSP) applications, memories such as memory 400 can be used in the construction of either the program memory or the data memory.

Figure 8:
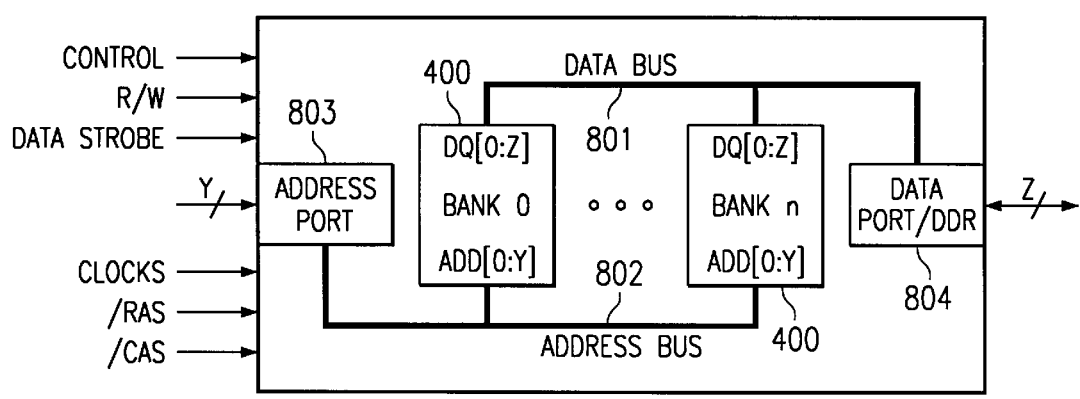
FIG. 8 illustrates an example of such a multibank memory.

Multibank memories can also be constructed according to the present invention. An example of such a multibank memory is shown in FIG. 8 generally at 800. Here, n number of banks 400 are utilized. It should be noted that in the multibank embodiment much of the control circuitry, the read and write buffers, and similar circuitry common to all banks, can be consolidated to minimize the required circuitry and consequently optimize chip space and power consumption.

A single data port 803 is shown along with a single address port 804. As discussed above, single or multiplied address ports or single or multiple data ports, can be used in any desired combination. The array organization will vary from design to design. For example, a 1 Gigabit device could be organized as sixteen (16) banks each having a cell array 402 of 4k rows by 256 columns (words) of 64 bits. Internally, the addresses from each of the ports are carried by corresponding address buses 801. Data exchanged with each bank's data port via an internal data bus 802.

Bank select in a multibank memory can be implemented using a selected number of the address bits received from the external controlling device. For example, if sixteen (16) banks are used, then four address bits, for example the 4 MSBs, from each address are required for 1 out of 16 bank selection. For the exemplary 4k row×256 word memory, 14 bits are required for row addressing and 8 bits for column (word) addressing.

Figure 7C:
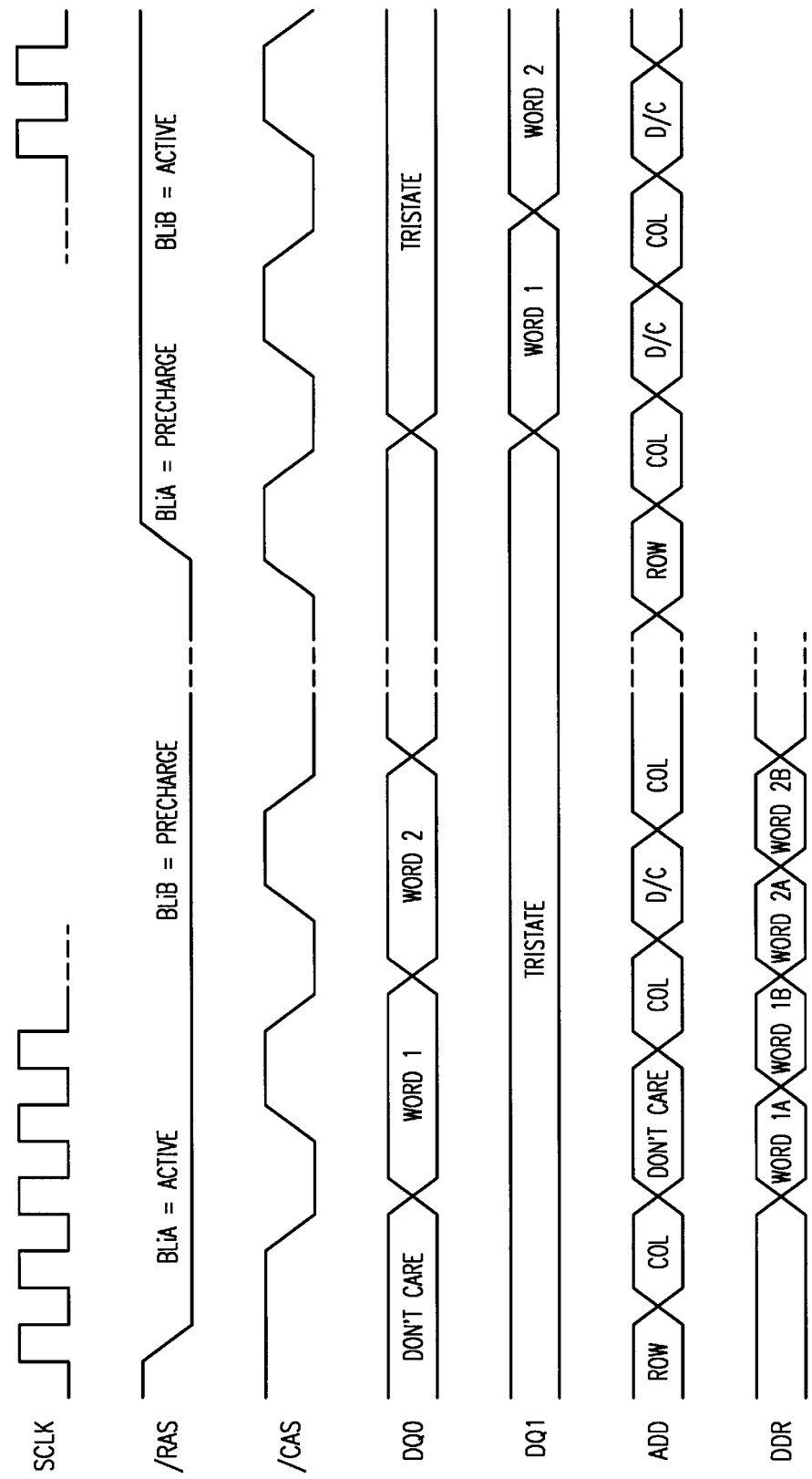
FIG. 7C illustrates operation of the alternative embodiment in which two address ports ADD0 and ADD1 are used (the lower two timing lines)

The memory in FIG. 8 includes a double data rate (DDR) circuitry in data (DQ) I/O port 804. DDR operation is illustrated in FIG. 7C.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory with transparent precharge capability comprising:
    an array comprising a plurality of memory cells, each said cell disposed at the intersection of an addressable row and an addressable column and accessible via a selected one of a pair of wordlines associated with said row and a selected one of a pair of bitlines associated with said column, wherein each of said memory cells coupled to a said pair of wordlines is coupled to a separate said pair of bitlines and said first and second bitlines addressable by addresses residing in different address spaces.

2. The memory of claim 1 wherein each said memory cell comprises:
    a data storage capacitor;
    a first gating device for coupling a first of said bitlines and said capacitor in response to a signal presented on a first of said wordlines; and
    a second gating device for coupling a second of said bitlines and said capacitor in response to a signal presented on a second of said wordlines.

3. The memory of claim 2 wherein each of said first and second gating devices comprises a transistor.

4. The memory of claim 2 wherein said first gating device selectively couples said first bitline with a selected plate of said capacitor and said second gating device selectively couples said second bitline with said selected plate of said capacitor.

5. A memory with transparent precharge capability comprising:
    an array comprising a plurality of memory cells, each said cell disposed at the intersection of an addressable row and an addressable column and accessible via a selected one of a pair of wordlines associated with said row and a selected one of a pair of bitlines associated with said column, wherein each of said memory cells coupled to a said pair of wordlines is coupled to a separate said pair of bitlines and wherein said first and second wordlines are addressable by addresses residing in a single address space and are selected in response to a toggle bit.

6. A memory array with transparent precharge capability organized as rows and columns of cells comprising:
    first and second wordlines defining each row;
    first and second bitlines defining each column;
    a first sense amplifier for sensing data presented on said first bitline;
    a second sense amplifier for sensing data presented on said second bitline;
    a memory cell disposed at an intersection of each said row and each said column, said memory cell comprising:
        a data storage capacitor;
        a first transistor for selectively coupling said first bitline of a corresponding column and a selected plate of said capacitor in response to a signal presented on said first wordline of a corresponding row;
        a second transistor for selectively coupling said second bitline of said corresponding column and said selected plate of said capacitor in response to a signal presented on said second wordline of said corresponding row; and
    wherein each said cell of a selected said row is coupled to a separate set of said first and second bitlines.

7. The memory array of claim 6 wherein said first and second transistors comprise n-channel devices.

8. The memory array of claim 6 and further comprising a row decoder for selecting one of said first and second wordlines.

9. The memory array of claim 8 wherein said row decoder selects said first wordline in response to a first address and said second wordline in response to a second address.

10. The memory array of claim 8 wherein said row decoder selects one of said first and second wordlines in response to an address and a toggle bit.

11. A transparently prechargeable memory bank comprising:
    an array of rows and columns of memory cells, a said row comprising first and second wordlines, a said column comprising a first and second bitlines, and a said cell comprising a data storage capacitor, a first gating device for coupling said first bitline of a corresponding said column and said capacitor in response to a signal presented on said first wordline of a corresponding said row, and a second gating device for coupling said second bitline of said corresponding column and said capacitor in response to a signal presented on said second wordline of said corresponding row and wherein each cell of a selected said row is coupled to a separate set of first and second bitlines;
    address decoding circuitry for accessing a selected said cell by selecting one of said wordlines and one of said bitlines of a corresponding row and a corresponding column including said selected cell in response to address bits;
    address input circuitry for transferring address bits to said address decoding circuitry comprising a first address port for receiving address bits for selecting said first wordline and first bitline of said corresponding row and column and a second address port for receiving address bits for selecting said second wordline and said second bitline of said corresponding column.

12. The memory bank of claim 11 wherein said address input circuitry comprises a single address port for receiving address bits for selecting one of said wordlines and one of said bitlines of said corresponding column.

13. The memory bank of claim 11 wherein said data input/output circuitry comprises a first data port for exchanging data with said first bitline and a second data port for exchanging data with said second bitline of said corresponding column.

14. The memory bank of claim 11 wherein said data input/output circuitry comprises a single data port for exchanging data with a selected one of said first and second bitlines of said corresponding column.

15. The memory bank of claim 11 wherein said array of rows and columns of cells are organized in an open bitline fashion.

16. A processing system comprising:
    a first processing resource;
    a second processing resource; and
    a memory comprising:
        an array of memory cells;
        first and second wordlines defining a row of said cells, said first processing resource selecting said row for access via said first wordline and said second processing resource selecting said row for access via said second wordline; and first and second bitlines defining a column of said cells, said first processing resource accessing a selected cell along said selected row via said first bitline and said second processing resource accessing said selected cell via said second bitline, and wherein each said cell of a selected row is coupled to a separate pair of first and second bitlines.

17. The processing system of claim 16 wherein said selected cell comprises:

a data storage capacitor;

a first transistor for selectively coupling said first bitline and a selected plate of said capacitor in response to a signal presented on said first wordline; and a second transistor device for selectively coupling said second bitline and said selected plate of said capacitor in response to a signal presented on said second wordline.

18. The processing system of claim 16 wherein said first and second processing resources selectively access said first and second bitlines via a single multiplexed data input/output port.

19. The processing system of claim 16 wherein said first and second processing resources selectively access said first and second bitlines via respective first and second data input/output ports.

20. The processing system of claim 16 wherein said first and second processing resources select said selected cell using address bits presented to a single address port.

21. The processing system of claim 16 wherein said first and second processing resources select said selected cell using address bits presented to first and second address ports respectively.

* * * * *